US012274026B2

(12) United States Patent
Hazra et al.

(10) Patent No.: US 12,274,026 B2
(45) Date of Patent: Apr. 8, 2025

(54) SYSTEMS FOR COOLER DEVICES AND COOLING MANIFOLDS

(71) Applicants: Toyota Motor Engineering & Manufacturing North America Inc., Plano, TX (US); The Board of Trustees of the Leland Stanford Junior University, Stanford, CA (US); The Regents of the University of California, Merced, Merced, CA (US); Alliance for Sustainable Energy, LLC, Golden, CO (US)

(72) Inventors: Sougata Hazra, Stanford, CA (US); Chi Zhang, Palo Alto, CA (US); Mehdi Asheghi, Oakland, CA (US); Kenneth E. Goodson, Portola Valley, CA (US); Ercan M. Dede, Ann Arbor, MI (US); James Palko, Merced, CA (US); Sreekant Narumanchi, Littleton, CO (US)

(73) Assignees: Toyota Motor Engineering & Manufacturing North America Inc., Plano, TX (US); Alliance for Sustainable Energy, LLC, Golden, CO (US); The Regents of the University of California, Merced, Merced, CA (US); The Board of Trustees of the Leland Stanford Junior University, Stanford, CA (US); United States Department of Energy, Washington, DC (US)

( * ) Notice: Subject to any disclaimer, the term of this patent is extended or adjusted under 35 U.S.C. 154(b) by 211 days.

(21) Appl. No.: 17/748,429

(22) Filed: May 19, 2022

(65) Prior Publication Data
US 2023/0380106 A1 Nov. 23, 2023

(51) Int. Cl.
*H05K 7/20* (2006.01)
*F28F 9/22* (2006.01)

(52) U.S. Cl.
CPC ........... *H05K 7/20272* (2013.01); *F28F 9/22* (2013.01); *H05K 7/20254* (2013.01)

(58) Field of Classification Search
CPC ... H05K 7/20272; H05K 7/20254; F28F 9/22; F28F 9/026; F28D 3/04
(Continued)

(56) References Cited

U.S. PATENT DOCUMENTS 6,366,462 B1 * 4/2002 Chu .................. H01L 23/427
257/714
6,863,117 B2 3/2005 Valenzuela
(Continued)

FOREIGN PATENT DOCUMENTS

KR 100381303 B1 4/2003

*Primary Examiner* — Tho V Duong
(74) *Attorney, Agent, or Firm* — DINSMORE & SHOHL LLP

(57) ABSTRACT

Disclosed herein are apparatus for a cooler device includes a manifold constructed at least partially of silicon oxide. The manifold includes an array of inlet channels and an array of outlet channels. Each inlet channel has a first depth. The array of outlet channels are interlaced with the array of inlet channels, Each outlet channel has a second depth that is larger than the first depth. Each of the array of outlet channels has a pair of sidewalls separating each outlet channel from adjacent inlet channels of the array of inlet channels.

17 Claims, 7 Drawing Sheets

(58) Field of Classification Search
USPC .......................................................... 165/80.4
See application file for complete search history.

(56) References Cited

U.S. PATENT DOCUMENTS

| | | | | |
|---|---|---|---|---|
| 7,017,654 | B2 * | 3/2006 | Kenny | H01L 21/4871 |
| | | | | 174/15.1 |
| 7,139,172 | B2 * | 11/2006 | Bezama | F28F 3/04 |
| | | | | 174/15.1 |
| 7,762,314 | B2 * | 7/2010 | Campbell | H01L 23/427 |
| | | | | 165/80.4 |
| 8,371,367 | B2 | 2/2013 | Chiba et al. | |
| 9,103,754 | B2 | 8/2015 | Handique et al. | |
| 9,131,631 | B2 * | 9/2015 | Joshi | H01L 23/4735 |
| 9,502,330 | B1 | 11/2016 | Gupta et al. | |
| 10,391,492 | B2 | 8/2019 | Handique et al. | |
| 10,533,809 | B1 * | 1/2020 | Sherrer | H01L 23/4735 |
| 11,211,538 | B1 * | 12/2021 | Pikulski | H01L 33/648 |
| 2003/0159806 | A1 | 8/2003 | Sehmbey et al. | |
| 2007/0119565 | A1 * | 5/2007 | Brunschwiler | H01L 23/4735 |
| | | | | 165/80.2 |
| 2007/0272392 | A1 * | 11/2007 | Ghosh | H01L 23/4336 |
| | | | | 257/714 |
| 2007/0274045 | A1 * | 11/2007 | Campbell | H05K 7/20772 |
| | | | | 165/80.4 |
| 2009/0314467 | A1 * | 12/2009 | Campbell | H01L 23/4735 |
| | | | | 165/80.4 |
| 2020/0227341 | A1 * | 7/2020 | Neal | F28F 3/12 |
| 2020/0376595 | A1 | 12/2020 | Binek et al. | |

* cited by examiner

SYSTEMS FOR COOLER DEVICES AND COOLING MANIFOLDS

STATEMENT OF GOVERNMENT INTEREST

The subject matter of the present disclosure was developed with government support under Contract Nos. DE-AC36-08GO28308 and DE-AR0001055 awarded by the U.S. Department of Energy. Accordingly, the government has certain rights in this subject matter.

TECHNICAL FIELD

The present specification generally relates to cooler devices for electronic devices and, more specifically, cooler devices having a cooling manifold with multidirectional profiles.

BACKGROUND

Heat management devices may be coupled to a heat generation device, such as a power electronics device or integrated circuit (e.g., central processing unit, CPU, or graphics processing unit, GPU), to remove heat and lower the operating temperature of the heat generating device. A liquid coolant, such as a cooling fluid, may be introduced to the heat management device, where it receives heat from the heat management device, primarily through convective and/or conductive heat transfer. The fluid may further remove heat through latent heat of vaporization as it changes phase from a liquid to vapor. The vapor and/or remaining liquid coolant is then removed from the heat management device, thereby removing heat from the heat generating device. As power electronic or integrated circuit devices are designed to operate at increased power levels, the devices generate an increased corresponding heat flux. The increase in heat flux generated by the power electronics devices may render conventional heat sinks inadequate to reject sufficient heat to maintain a desired operating temperature in the power electronics device. Further, as power electronics modules or integrated circuit multi-chip modules are incorporated into increasingly compact and variable arrangements, more configurable and scalable cooling assemblies are desired.

SUMMARY

In one embodiment, apparatus for a cooler device includes a manifold constructed at least partially of silicon. The manifold includes an array of inlet channels and an array of outlet channels. Each inlet channel has a first depth. The array of outlet channels are interlaced with the array of inlet channels. Each outlet channel has a second depth that is larger than the first depth. Each of the array of outlet channels has a pair of sidewalls separating each outlet channel from adjacent inlet channels of the array of inlet channels.

In another embodiment, apparatus for a cooler device includes a cold plate, manifold constructed at least partially of silicon and a manifold case. The manifold includes an array of inlet channels and an array of outlet channels interlaced with the array of inlet channels. Each inlet channel has a first depth. Each outlet channel has a second depth that is larger than the first depth. Each of the array of outlet channels has a pair of sidewalls separating each outlet channel from adjacent inlet channels of the array of inlet channels. The manifold case is configured to be in contact with the cold plate and encapsulate the manifold, the array of inlet channels, and the array of outlet channels.

In yet another embodiment, a cooler device includes a manifold constructed at least partially of silicon. The manifold includes an array of inlet channels and an array of outlet channels. Each inlet channel has a first depth. The array of outlet channels are interlaced with the array of inlet channels. Each outlet channel has a second depth that is larger than the first depth. Each of the array of outlet channels has a plurality of pin fins disposed on opposing sides of each outlet channel.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
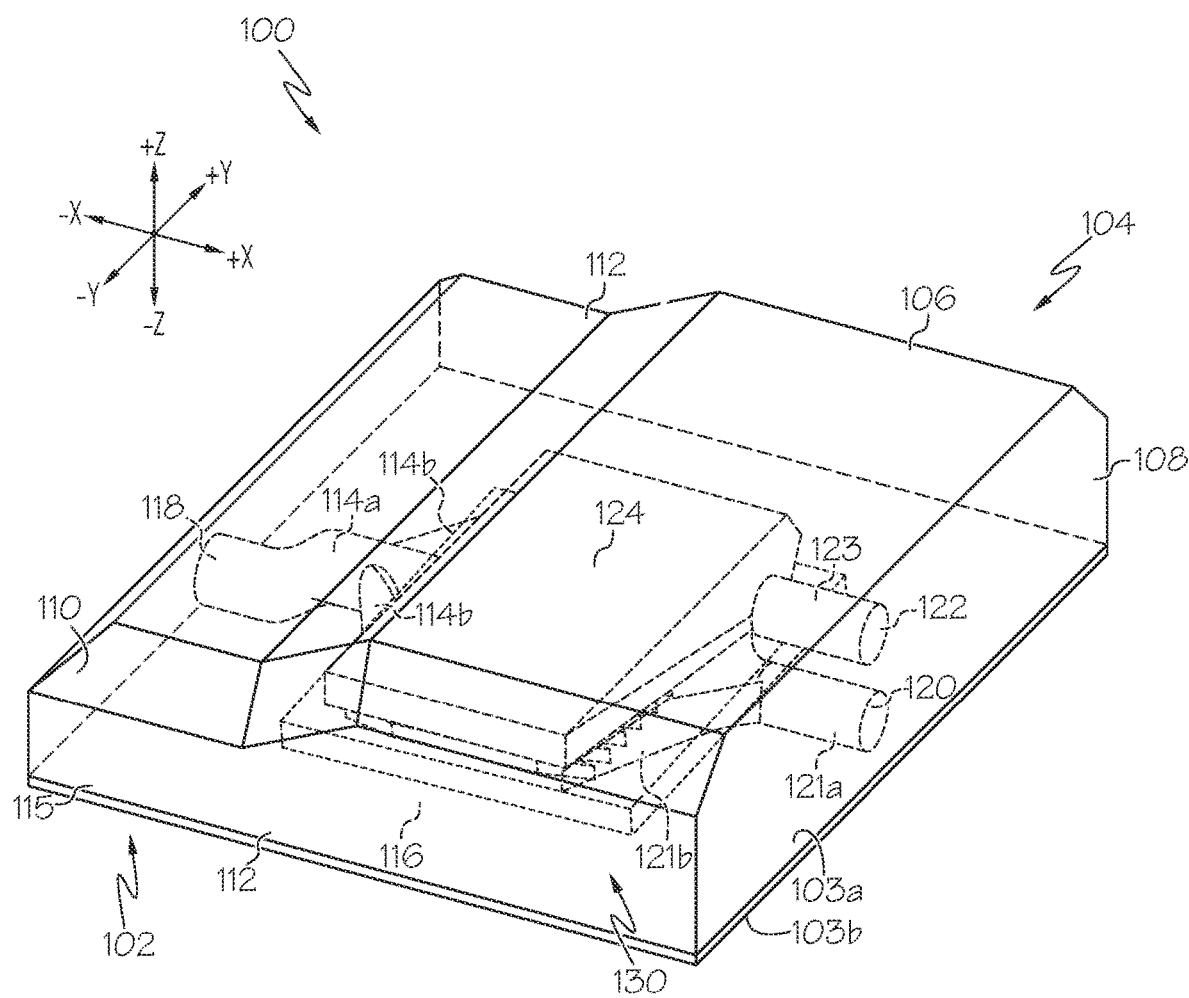
FIG. 1 schematically depicts a perspective view of a cooler device, according to one or more embodiments shown and described herein.

Embodiments described herein are directed to a cooler device for thermal management of CPU or GPU devices found in data centers, or power electronics semiconductor devices found in vehicle energy conversion applications. As described in more detail herein, the cooler devices of the present disclosure may include a cold plate, a manifold, and a manifold case, or cover. The manifold case includes a fluid inlet, a fluid outlet, and at least one vapor outlet. The manifold may be constructed at least partially of silicon and may define a variety of three-dimensional hierarchical profiles. The three-dimensional hierarchical profiles allow for shorter coolant travel paths while reducing coolant pressure drop for coolant traveling in the manifold. In this way, the manifold provides improved cooling capabilities. The manifold includes an array of inlet channels and an array of outlet channels. Each inlet channel has a first depth. The array of outlet channels are interlaced with the array of inlet channels. Each outlet channel has a second depth that is larger than the first depth. Each of the array of outlet channels has a pair of sidewalls separating each outlet channel from adjacent inlet channels of the array of inlet channels. Various embodiments of the apparatus and the operation of the apparatus are described in more detail herein. Whenever possible, the same reference numerals will be used throughout the drawings to refer to the same or like parts.

As used herein, the term "longitudinal direction" refers to the forward-rearward direction of the cooler device assembly (i.e., in the +/−X-direction depicted in FIG. 1). The term "lateral direction" refers to the cross-cooler device direction (i.e., in the +/−Y-direction depicted in FIG. 1), and is transverse to the longitudinal direction. The term "vertical direction" or "up" or "above" or "below" refer to the upward-downward direction of the cooler device (i.e., in the +/−Z-direction depicted in FIG. 1).

Figure 2:
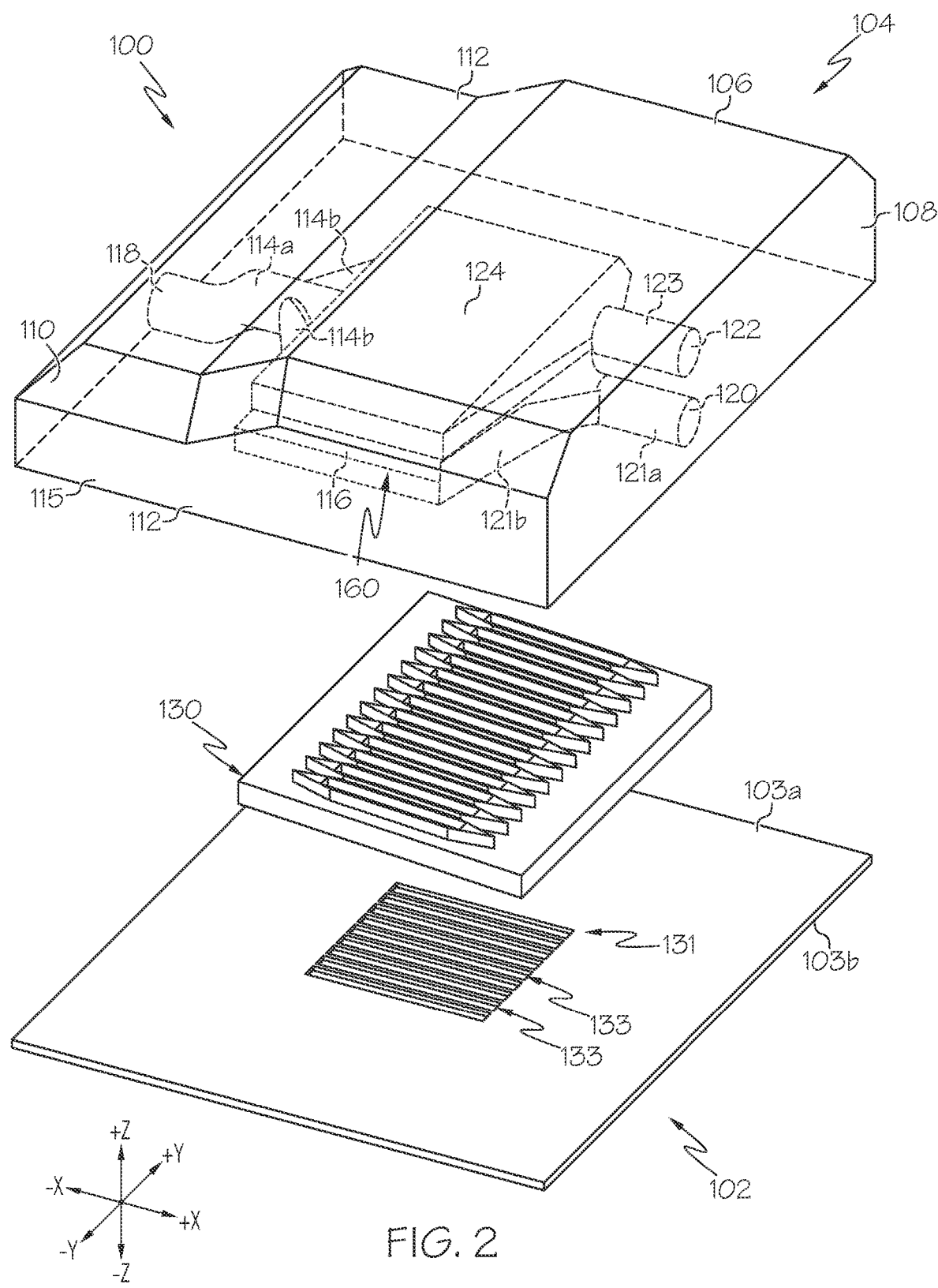
FIG. 2 schematically depicts an exploded view of a cooler device, according to one or more embodiments shown and described herein.
Figure 3:
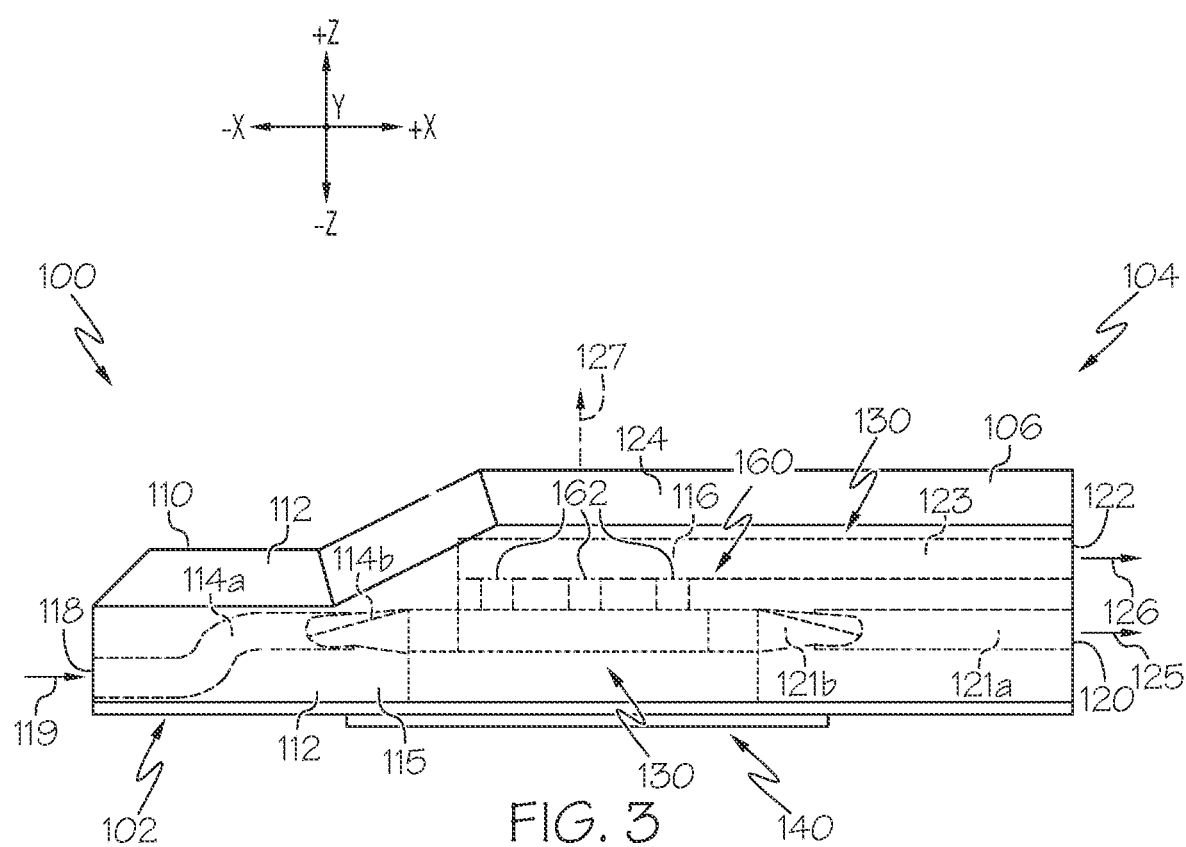
FIG. 3 schematically depicts a side view of a cooler device, according to one or more embodiments shown and described herein.

Turning now to the figures, FIGS. 1-3 depict various schematic depictions of an example cooler device 100. The cooler device 100 may be a heat flux micro-cooler (e.g., μ-cooler) capable of removing, for example, a heat flux of power electronics device of 1000 W/cm$^2$ or more over a device size of 3 cm$^2$ with a temperature superheat of 20° C., and a thermal resistance of 0.02 cm$^2$-° C./W. In some embodiments, the cooler device 100 may be known as an extreme heat flux micro-cooler ("EHF μ-Cooler").

The cooler device 100 may include a manifold 130 constructed at least partially of silicon oxide, a cold plate 102, and a manifold case 104. The manifold 130 may be configured to wick coolant after interfacing with the manifold 130. The manifold case 104 may act as a cover to enclose portions of the cold plate 102 and the manifold 130, as discussed in greater detail herein.

The manifold 130 and cold plate 102 may be constructed at least partially of silicon and/or silicon dioxide. Silicon may have a substantially similar coefficient of thermal expansion (CTE) to that of a power electronics chip constructed at least partially of silicon, silicon carbide, or other semiconductor materials. This is advantageous as it creates a stable thermo-mechanical heat transfer path from the heat source (e.g., power electronics chip) to the manifold 130. Further, the use of silicon facilitates for the manifold 130 to be fabricated through multiple rounds or a single pass of lithography. This may result in the fabrication of more precise features and three-dimensional features (e.g., such as coolant inlets, jet nozzles, pin fins).

A heat-generating device 140 may be thermally coupled to the cold plate 102, as best depicted in FIG. 3 by way of a high temperature capable (e.g., >150° C.) die-attach material layer (not shown). The heat-generating device 140 may be a central processing unit (CPU) or a graphics processing unit (GPU) that use integrated circuits and are commonly found and associated with data centers. Further, the heat-generating device 140 may be a power device that may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 140 may include a wide-bandgap semiconductor, and may be formed from any suitable material such as, but not limited to, silicon carbide (SiC), silicon oxide (SiO), aluminum nitride (AlN), gallium nitride (GaN), and boron nitride (BN), and the like. In some embodiments, the heat-generating device 140 may include ultra-wide-bandgap devices formed from suitable materials such as AlGaN/AlN, Ga2O3, and diamond. In some embodiments, the heat-generating device 140 may operate within a power module having a high current and/or a high power and under high temperatures (for example, in excess of 100° C., 150° C., 175° C., 200° C., 225° C., or 250° C.) and dissipate a large amount of power in the form of heat that must be removed for the continued operation of the heat-generating device 140.

Accordingly, the heat-generating device 140 may be suitable in vehicle power electronics, in data center applications with integrated circuits, and the like. The heat generated by the heat-generating device 140 may be transferred away via the cooler device 100 to cool the heat-generating device 140.

Still referring to FIGS. 1-3, the manifold case 104, as depicted, includes a top wall 106 (also referred to herein as the top surface). Further, the manifold case 104, as depicted, includes a first wall 108 (also referred to herein as the front surface) and an opposite second wall 110 (also referred to herein as the back surface), and a pair of side walls 112 positioned to extend between the first wall 108 and the second wall 110. Each of the first wall 108, the second wall 110, and the pair of side walls 112 extend from the top wall 106 in the vertical direction (i.e., in the +/−Z direction) to form a cavity 115 there between.

The manifold case 104 may be made of non-electrically conductive material such as a plastic, a ceramic, or a composite material and may be formed via traditional methods such as injection molding, and/or may be formed via additive methods. The manifold case 104 is configured to cover, or enclose, the manifold 130 and at least portions of the cold plate 102, as discussed in greater detail herein. In particular, the manifold case 104 further includes a receiving recess 116 that is shaped dimensionally to receive the manifold 130 when the manifold case 104 is positioned to abut the cold plate 102, as best illustrated in FIGS. 1 and 3.

The manifold case 104 may include a fluid inlet 118, a fluid outlet 120, and at least one vapor outlet 122. The fluid inlet 118 may be configured to receive a liquid coolant, as depicted by the arrow labeled 119 in FIG. 3. Non-limiting example liquid coolants include dielectric cooling fluids such as deionized water, R-245fa, and FIFE-7100. Other dielectric cooling fluids may be utilized. The type of dielectric cooling fluid chosen may depend on the operating temperature of the heat generating devices to be cooled.

The manifold case 104 may further include a bottom cap surface 160. The bottom cap surface 160 is configured to sit upon an array of outlet channels of the manifold 130 when the cooler device 100 is assembled. The bottom cap surface 160 may include a plurality of vapor vents 162 to receive vapor from the manifold 130. In this way, the manifold 130 may provide vapor to the manifold case 104 that may then exit the cooler device 100 via the at least one vapor outlet 122. The bottom cap surface 160 may be formed via an additive manufacturing process such as forming, molding, 3D printing, or any suitable additive manufacturing process.

Still referring to FIGS. 1-3, the fluid inlet 118 is fluidly coupled to the receiving recess 116 of the manifold case 104 via an inlet conduit 114a, which is in fluid communication with a pair of inlet fluid channels 114b that extend from the inlet conduit 114a. As such, in some embodiments, the liquid coolant 119 may be split between each of the pair of inlet fluid channels 114b. The fluid outlet 120 is configured to receive the liquid coolant 119 from the receiving recess 116 and/or the manifold 130 via a pair of outlet fluid channels 121b that extend from the receiving recess 116 and/or the manifold 130 and fluidly couple to an outlet conduit 121a. The outlet conduit 121a is in fluid communication with the fluid outlet 120. The now heated liquid coolant is expelled from the manifold case 104 via the fluid outlet 120, as depicted by the arrow labeled 125 in FIG. 3. The flow of the liquid coolant between being delivered to the receiving recess 116 and being dispensed from the receiving recess 116 will be described in more detail herein.

The at least one vapor outlet 122 may be positioned above the receiving recess 116 and the fluid outlet 120 in the vertical direction (i.e., in the +/−Z direction). That is, the at least one vapor outlet 122 may be positioned closer in proximity to the top wall 106 than the fluid outlet 120.

Further, in this example embodiment, the vapor, as depicted by the arrow labeled 126 in FIG. 3, may travel to exit the manifold case 104 in at least one direction that is parallel to the direction of the liquid coolant 126 exiting the manifold case 104 via the fluid outlet 120. As such, the vapor 126 exiting the manifold 130 may follow a curvilinear or arcuate flow path, as discussed in greater detail herein. In embodiments, a vapor cavity 124 may be positioned directly above portions of the receiving recess 116. The vapor cavity 124 may be fluidly coupled to a vapor conduit 123, which is fluidly coupled to the at least one vapor outlet 122. Vapor may vertically enter the vapor cavity 124 prior to exiting the manifold case 104 via the vapor conduit 123 and the at least one vapor outlet 122.

In other embodiments, an additional at least one vapor outlet 122 is positioned to be fluidly coupled to the vapor cavity 124 such that the vapor may exit the manifold case 104 via the additional at least one vapor outlet 122, as depicted by the arrow labeled 127 in FIG. 3. It should be understood that in embodiments with the additional at least one vapor outlet 122 positioned to be fluidly coupled to the vapor cavity 124, the vapor conduit 123 may not be used by the additional at least one vapor outlet 122 and instead vapor may exit directly from the vapor cavity 124. It should also be understood that in some embodiments, the vapor cavity 124 and both the vertical exit and the at least one vapor outlet 122 may be utilized to expel vapor transported from within the manifold 130 and/or the receiving recess 116 out of the manifold case 104.

Now referring to FIG. 2, an example cold plate 102 will be described. The cold plate 102 may include a support member 131 and an array of bonding posts 133. In some embodiments, the array of bonding posts 133 may be a region that surrounds the support member 131. It should be appreciated that the cold plate 102 may be formed by etching a silicon wafer or by micromachining a Cu substrate. As such, in some embodiments, the cold plate 102 may be a silicon material. In other embodiments, the cold plate 102 may Cu, AlSiC, or other materials.

The array of bonding posts 133 may include an upper surface 103a and an opposite lower surface 103b. In the resulting cavity between the array of bonding posts 133, a porous metal layer, such as an inverse opal structure (not shown), may be formed to facilitate two-phase (e.g., boiling) heat transfer via wick capillary action at the cold plate 102 when coolant is delivered to the cold plate surface from the manifold 130 to carry away heat generated by the heat-generating device 140. The upper surface 103a may be in contact with, or abut, the manifold case 104. That is, the upper surface 103a may be planar and provide a mounting or coupling surface for the manifold case 104 to rest on, abut, or bond onto, as discussed in greater detail herein. In some embodiments, portions of the lower surface 103b may be coupled to the heat-generating device 140 via a direct die-attach material or thermal grease.

The thickness of the cold plate 102 may depend on the intended use of the cooler device 100. That is, the thickness may vary depending on whether the heat-generating device 140 (FIG. 3) is an integrated circuit CPU/GPU or a power electronic semiconductor. As such, the illustrated embodiments and present disclosure are non-limiting as the thickness of the cold plate 102 varies.

Manifolds are typically fabricated through etching and/or cutting into a sacrificial mask layer of the manifold. These systems may be limited to two-dimensional designs due to conventional materials used to construct the sacrificial mask layer of the manifold. The use of two-dimensional designs may limit the cooling capabilities of the cold plate and/or the cooling device. Additionally, in conventional systems for fabricating chip-scale manifolds may consist of stacking multiple silicon wafer layers. These systems may be prone to pre-mature wear, high fabrication costs/complexity, and large pressure drops.

The manifolds 130 disclosed herein may be constructed at least partially of silicon, is shown according to some embodiments. In particular, a sacrificial layer of the manifold 130 is at least partially constructed of silicon oxide. This allows for multiple depths of lithography to be performed in a single process flow on the sacrificial mask layer of the manifold. Due to the ability to create multiple feature depth through a single application of lithography, three-dimensional shapes may be formed in the manifold 130 at lower cost/complexity. This allows for increased commercial capabilities of creating and utilizing three-dimensional shapes to enhance the cooling capabilities of the cooler device 100.

Figure 4A:
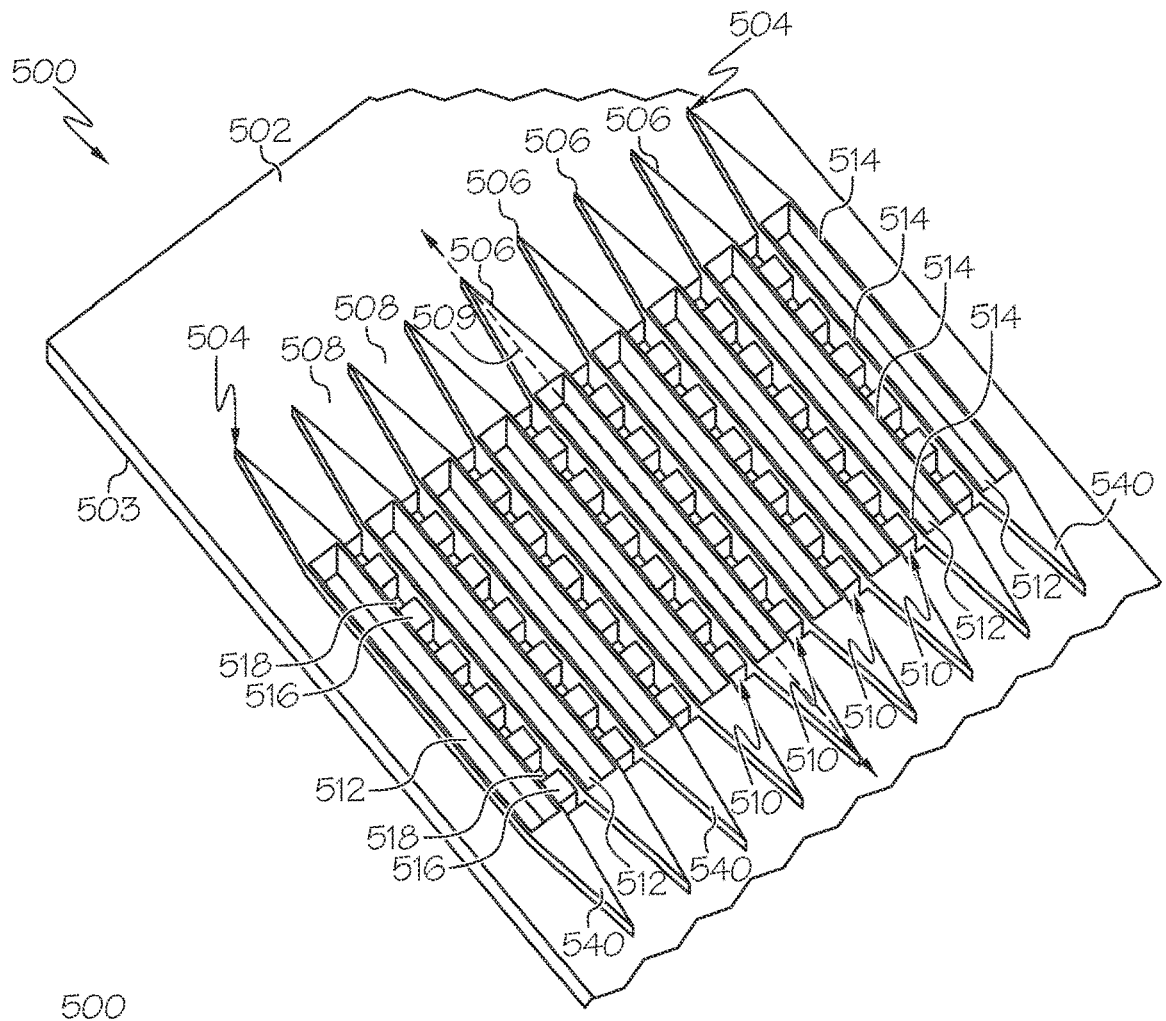
FIG. 4A schematically depicts a perspective view of a manifold, according to one or more embodiments shown and described herein.
Figure 4B:
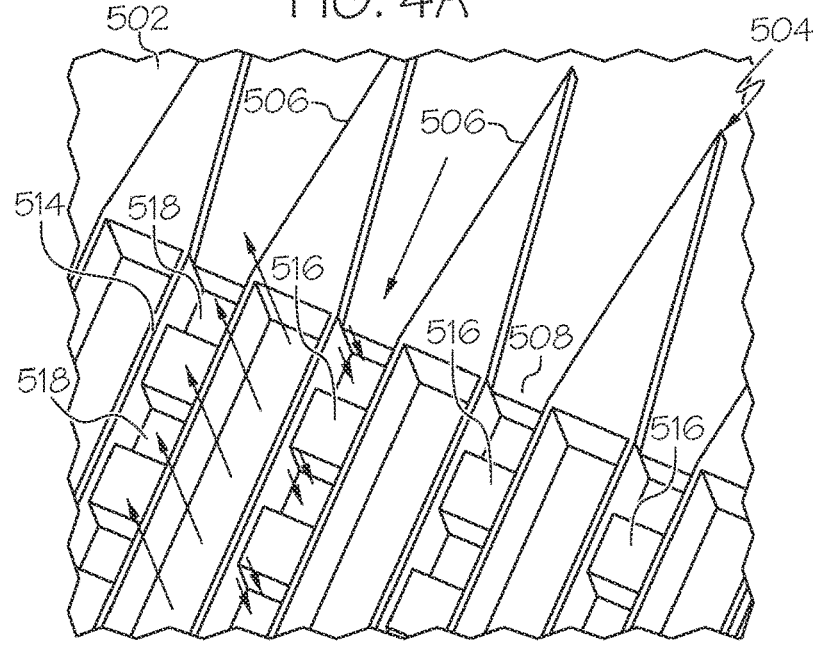
FIG. 4B schematically depicts another perspective view of the manifold shown in FIG. 4A.

Now referring to FIGS. 4A and 4B, an example manifold 500 is shown, according to varying embodiments. The manifold 500 may be constructed partially of silicon oxide, silicon, gallium nitride, metals, or any other materials of the like. The manifold 500 may be similar to the manifold 130 as disclosed in FIGS. 1-3. The example manifold 500 includes a manifold top surface 502 and a manifold bottom surface 503 opposite to the manifold top surface 502. The manifold top surface 502 may define a substantially planar profile, but other geometries are contemplated and possible (e.g., curved, stepped, etc.). Coolant entering the manifold 500 may first travel along the manifold top surface 502. The manifold bottom surface 503 may define a substantially planar profile, but other geometries are contemplated and possible (e.g., curved, stepped, etc.).

The manifold 500 may further include an array of inlet guides 504 (e.g., coolant guides) which direct the coolant flow that has entered the manifold 500. The array of inlet guides 504 distribute coolant in a predetermined way along a width of the manifold 500. In this way, the cooling capabilities of the manifold 500 may be increased by directing coolant to targeted locations in the manifold 500. Further, a pair of inlet guides 504 may co-operate to define profiles that decrease the cross-sectional area interfacing with the coolant, so that the velocity of the coolant may increase locally. In this way, the cooling rate within the manifold 500 may be increased. Each of the array of inlet guides 504 protrude from the manifold top surface 502. Each of the array of inlet guides 504 are integral to the manifold 500 and formed by way of the multi-step single application lithography etching process previously described.

As depicted, the array of inlet guides 504 define a triangular profile, but other profiles are contemplated and possible (e.g., rounded profile, staggered profile, etc.). Each of the array of inlet guides 504 are centered upon a longitudinal axis 509 of the manifold 500. Each of the inlet guides 504 include a pair of guide sidewalls 506 and an inlet area 508. A pair of adjacent inlet guides 504 cooperate by sharing a guide sidewall 506 of each inlet guide 504, thereby defining each inlet area 508. Each guide sidewall 506 may taper away from the longitudinal axis 509. In this way, the pair of adjacent inlet guides 504 cooperate to guide coolant through each inlet area 508. In embodiments, each inlet area 508 may define a substantially flat profile. In other embodiments, each inlet area 508 may be sloped from the manifold top surface 502 and towards the manifold bottom surface 503. In this way, the coolant may increase its velocity due to gravitational forces.

The manifold 500 further includes an array of fluid inlet channels 510, an array of vapor outlet channels 512, and an array of sidewalls 514. The array of inlet channels 510 and the array of outlet channels 512 may be interlaced with each other, such that each inlet channel 510 is encompassed by (e.g., adjacent to) two outlet channels 512. Further, each outlet channel 512 may be encompassed by two inlet channels 510. In this way, coolant entering the manifold 500 is evenly distributed along the width of the manifold 500. As depicted, each of the inlet channels 510 and each of the outlet channels 512 define substantially similar sizes in width. However, in various embodiments, each of the inlet channels 510 and each of the outlet channels 512 may define different widths. Each of the array of outlet channels 512 may be separated from each of the array of inlet channels by a pair of sidewalls of the array of sidewalls 514.

In embodiments, varying configurations for interlacing the array of inlet channels 510 and the array of outlet channels 512 are contemplated. For example, each of the array of inlet channels 510 may define larger widths, relative to the array of outlet channels 512, to receive more fluid coolant In these embodiments, there may be a higher number of outlet channels 512 relative to the number of inlet channels 510. In another example, the manifold 500 may be designed such that each of the array of vapor outlet channels 512 may define larger widths, relative to the array of inlet channels 510, to provide reduced vapor flow resistance out of the manifold 500. In these embodiments, the number of outlet channels 512 may be equal to the number of inlet channels 510. These examples, should be in no way limiting and are disclosed to illustrate varying configurations for interlacing the array of inlet channels 510 and the array of outlet channels 512.

The array of inlet channels 510 extend along a portion of a depth of the manifold 500 (e.g., extending partially into the manifold 500). Each of the array of inlet channels may define a first depth from a bottom surface of each of the array of inlet channels 510 to the manifold top surface 502 of the manifold 500. The array of inlet channels 510 are configured to receive coolant via fluid pumping and/or wicking capillary action from each of the inlet areas 508. The array of inlet channels 510 may then transfer coolant (by wicking capillary action, for example) along a length of each of the inlet channels 510. This configuration reduces the travel path of the coolant, which in turn reduces a pressure drop of the fluid as it travels through the manifold 500. As illustrated in FIGS. 4A and 4B, the pair of sidewalls 514 prevent fluid coolant that has entered the array of inlet channels 510 from entering the array of vapor outlet channels 512. In this way, the coolant flow within the manifold 500 is uninterrupted and does not bypass the cold plate where boiling heat transfer occurs. The array of inlet channels 510 may be formed in the manifold 500 using the multi-step single pass lithography etch process previously described.

The array of inlet channels 510 of the manifold 500 includes a plurality of spacer elements 516 that define a plurality of channel cavities 518. The plurality of spacer elements 516 are interlaced with the plurality of channel cavities 518 and are distributed along a length of the array of inlet channels 510. Each of the plurality of channel cavities 518 are defined by a pair of adjacent spacer elements 516 and extend along a depth of the manifold 500 (e.g., from the manifold top surface 502 to the manifold bottom surface 503 of the manifold 500). Each pair of adjacent spacer elements 516 cause each channel cavity 518 to operate as a type of nozzle for coolant to enter. In other words, as coolant enters the array of inlet channels 510 from the inlet area. 508, the coolant is distributed along the length of each of the array of inlet channels 510 within the plurality of channel cavities 518. The rate of the coolant may then be modified as it enters each channel cavity 518. This allows for coolant to be targeted to predetermined areas of the manifold 500, which facilitates for targeted cooling capabilities within the manifold 500.

After coolant has interfaced with the array of inlet channels 510, a cold plate (e.g., such as cold plate 102), and any other component of a cooler device (e.g., such as cooler device 100), coolant in the form of mostly vapor exits through the array of outlet channels 512. The array of outlet channels 512 extend along the depth of the manifold 500 (e.g., from the manifold bottom surface 503 of the manifold 500 to a top surface of the array of outlet channels 512). The array of outlet channels 512 define a second depth from the manifold bottom surface 503 of the manifold 500 to the top surface of the array of outlet channels 512. The second depth is larger than the first depth of the array of inlet channels 510. In this way, vapor may exit the array of outlet channels 512 and is uninterrupted by the coolant flow of the array of inlet channels 510. Each of the array of outlet channels 512 may share a center axis (e.g., being coaxial) with each of the inlet guides 504. In this way, the manifold 500 defines a compact package size. Each of the array of outlet channels 512 and the array of sidewalls 514 may be integrated to the manifold 500 (e.g., via machining, molding, casting) or coupled to the manifold 500 (e.g., via fastening, welding).

The manifold 500 may further include an array of outlet guides 540 (e.g., coolant guides) which direct the flow of coolant that did not enter into the array of inlet channels 510 out of the manifold 500. In other words, the array of outlet guides 540 provide a coolant bypass for the manifold 500. This is advantageous as it prevents a bottleneck in the coolant flowing though the manifold 500. Each of the array of outlet guides 540 protrude from the manifold top surface 502. Each of the array of outlet guides 510 may be formed in the manifold 500 using the multi-step single pass lithography etch process previously described.

As depicted, the array of outlet guides 540 define a triangular profile, but other profiles are contemplated and possible (e.g., rounded profile, staggered profile). Each of the array of outlet guides 540 are centered upon the longitudinal axis 509 of the manifold 500. Each of the outlet guides 540 may taper away from the longitudinal axis 509, thereby allowing for an increased volume of liquid coolant to exit the manifold 500. The array of outlet guides 540 may be structured substantially similar to the array of inlet guides 504. In this way, the manifold 500 may be symmetrical along an axis orthogonal to the longitudinal axis 509. This is advantageous as it allows for the manifold 500 to be assembled in either orientation and improves the assembly process of the manifold 500 to the cooler device.

Figure 5A:
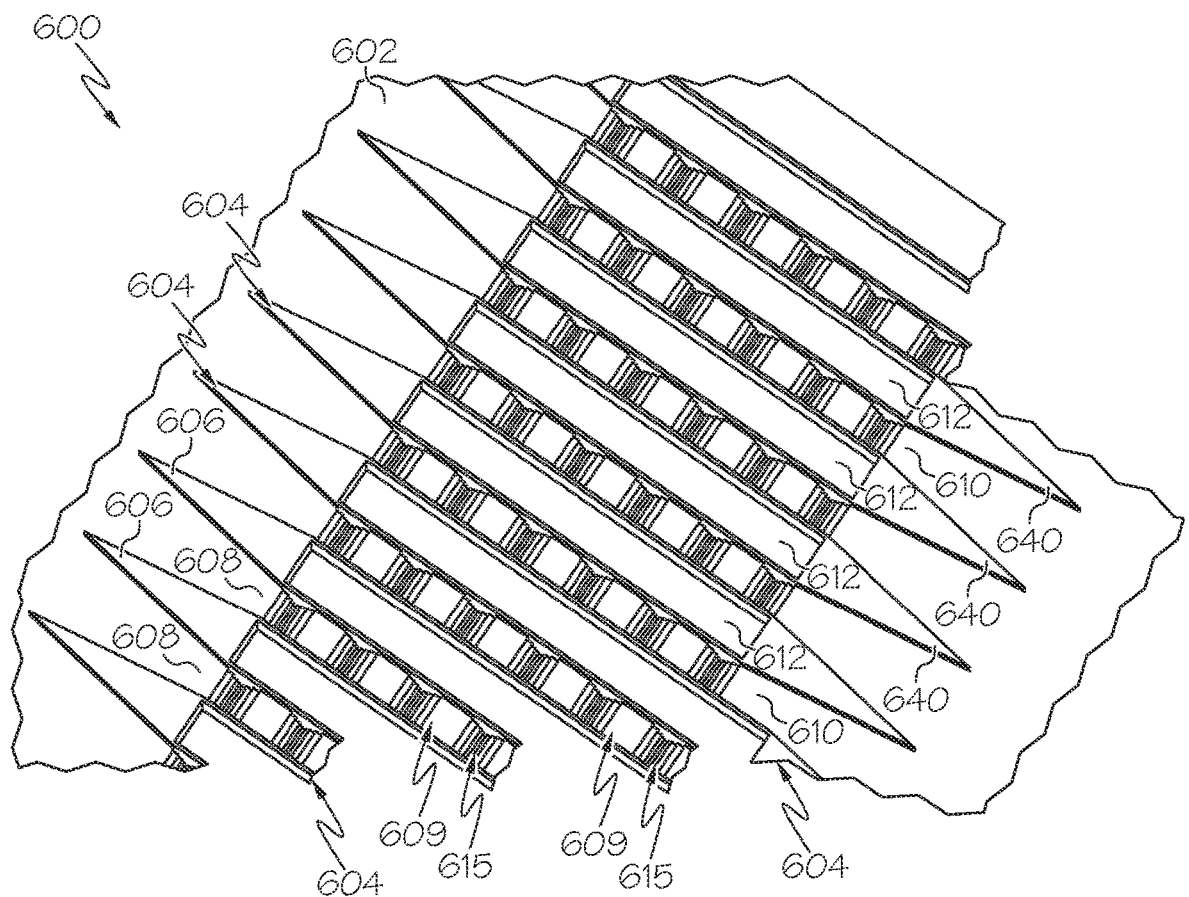
FIG. 5A schematically depicts a perspective view of a manifold, according to one or more embodiments shown and described herein.
Figure 5B:
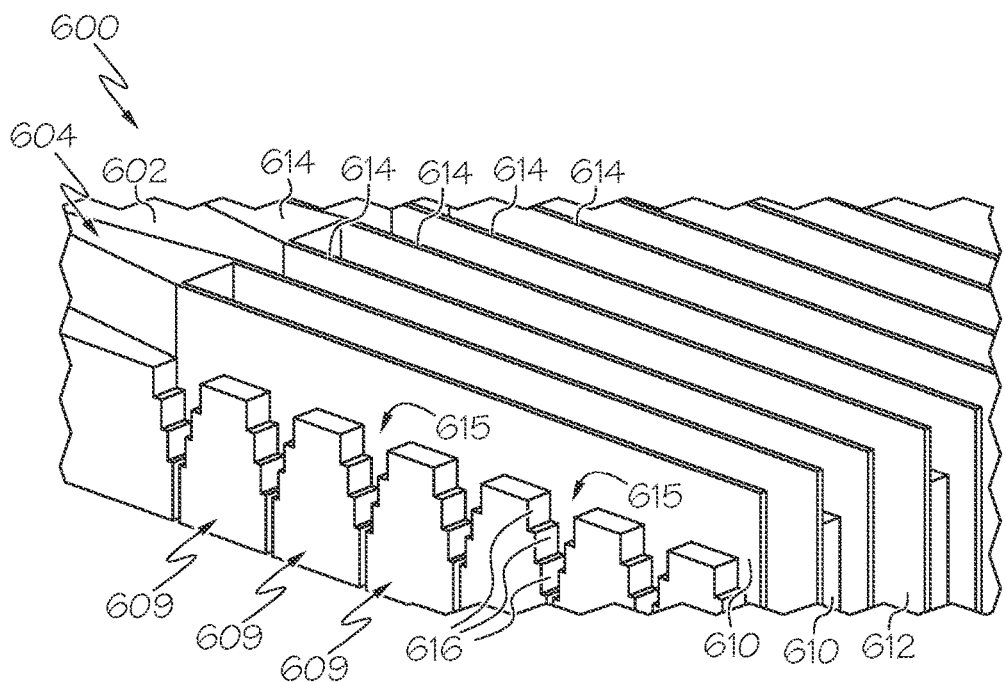
FIG. 5B schematically depicts another perspective view of the manifold shown in FIG. 5A.

Now referring to FIGS. 5A and 5B, a manifold 600 constructed is shown, according to varying embodiments. The manifold 600 may be constructed partially of silicon oxide, silicon, gallium nitride, metals, or any other material of the like. The manifold 600 may be similar in nature to manifold 130, and manifold 500, as discussed in greater detail above. The manifold 600 may include a manifold top surface 602, a manifold bottom surface 603, an array of inlet guides 604, an array of inlet channels 610, an array of outlet channels 612, an array of outlet guides 640, and an array of sidewalls 614. The array of inlet guides 604 may include a guide sidewall 606 and an inlet area 608.

As compared to the manifold 500 disclosed in FIGS. 4A and 4B, the array of inlet channels 610 of the manifold 600 may include a plurality of spacer elements 609 defining a plurality of channel cavities 615. The plurality of spacer elements 609 are interlaced with the plurality of channel cavities 615 and are distributed along a length of the array of inlet channels 610. This allows for coolant to be targeted to predetermined areas of the manifold 600 which facilitates targeted cooling capabilities within the manifold 600.

Each of the plurality of channel cavities 615 may define a plurality of steps 616 that decrease in width as the plurality of channel cavities 615 extend away from the manifold top surface 602 of the manifold 600. In this way, each of the plurality of channel cavities 615 define a multi-step inlet profile for the coolant to enter into. This may modify the velocity of the coolant traveling through each channel cavities 615, thereby controlling the overall fluid delivery across the manifold 600. Each of the multi-step channel cavities 615 may be formed in the manifold 600 using the multi-step single pass lithography etch process previously described.

Figure 6A:
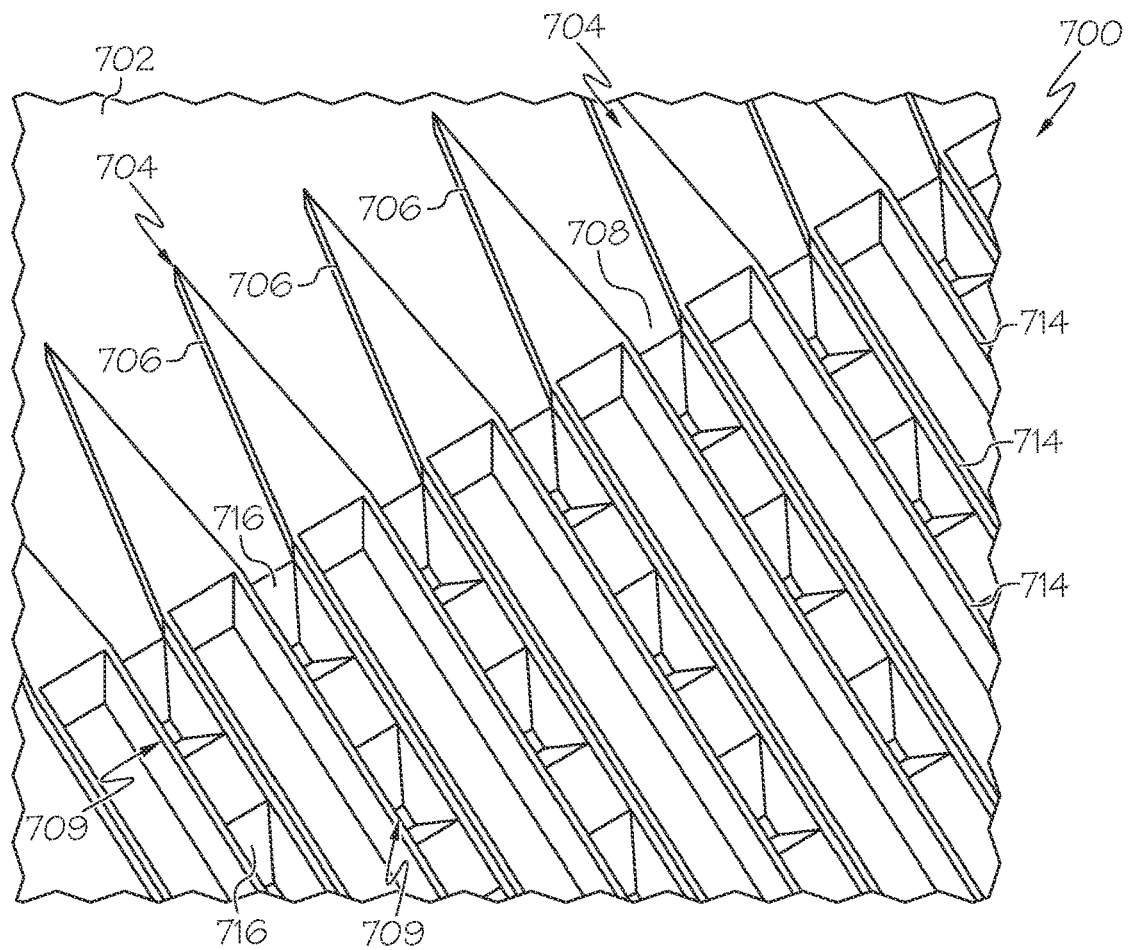
FIG. 6A schematically depicts a perspective view of a manifold, according to one or more embodiments shown and described herein.
Figure 6B:
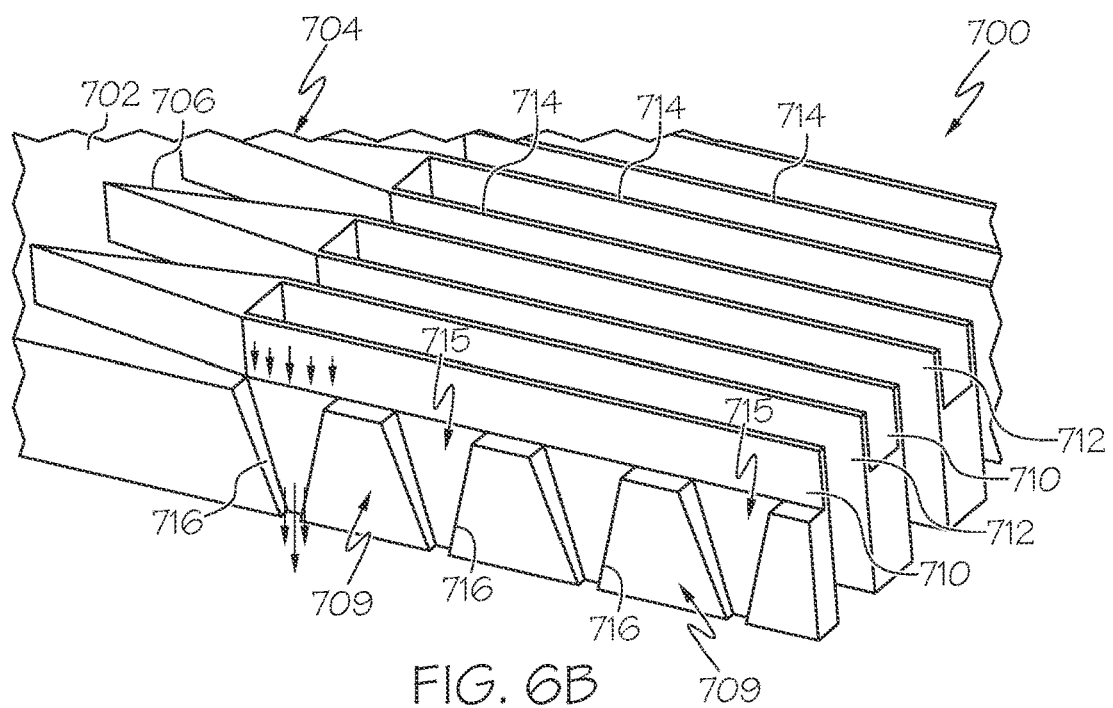
FIG. 6B schematically depicts a detailed view of the manifold shown in FIG. 6A.

Now referring to FIGS. 6A and 6B, a manifold 700 is shown, according to varying embodiments. The manifold 700 may be constructed partially of silicon oxide, silicon, gallium nitride, metals, or any other material of the like. The manifold 700 may be similar in nature to manifold 130, manifold 500, and manifold 600, as discussed in greater detail above. The manifold 700 may include a manifold top surface 702, a manifold bottom surface 703, an array of inlet guides 704, an array of inlet channels 710, an array of outlet channels 712, an array of outlet guides 740, and an array of sidewalls 714. The array of inlet guides 704 may include a guide sidewall 706 and an inlet area 708.

As compared to the manifold 600 disclosed in FIGS. 5A and 5B, the array of inlet channels 710 of the manifold 700 may include a plurality of spacer elements 709 defining a plurality of channel cavities 715. The plurality of spacer elements 709 are interlaced with the plurality of channel cavities 715 and are distributed along a length of the array of inlet channels 710. This allows for coolant to be targeted to predetermined areas of the manifold 700 which allows for targeted cooling capabilities within the manifold 700.

Each of the plurality of channel cavities 715 may define cavity side-walls 716 that decrease in width as the plurality of channel cavities 715 extend away from the manifold top surface 702 of the manifold 700. In this way, each of the plurality of channel cavities 715 define a tapering profile, and accordingly, a jetted inlet profile for the coolant to enter into. This may modify the velocity of the coolant traveling through each channel cavities 715, thereby benefiting the cooling capabilities of the manifold 700.

In conventional systems, coolant vapor exiting an outlet channel may become entrapped within the manifold. Entrapped vapor may result in disrupted coolant flow and inefficient cooling.

Figure 7A:
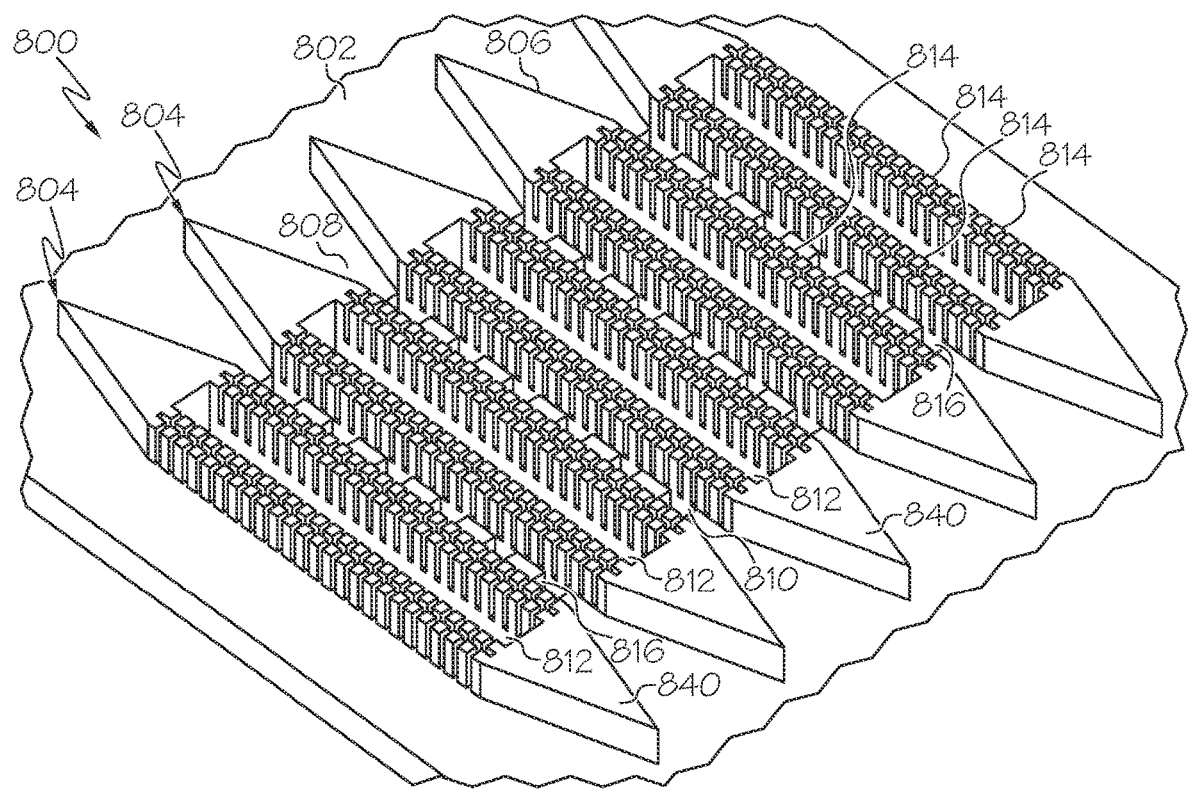
FIG. 7A schematically depicts a perspective view of a manifold, according to one or more embodiments shown and described herein.
Figure 7B:
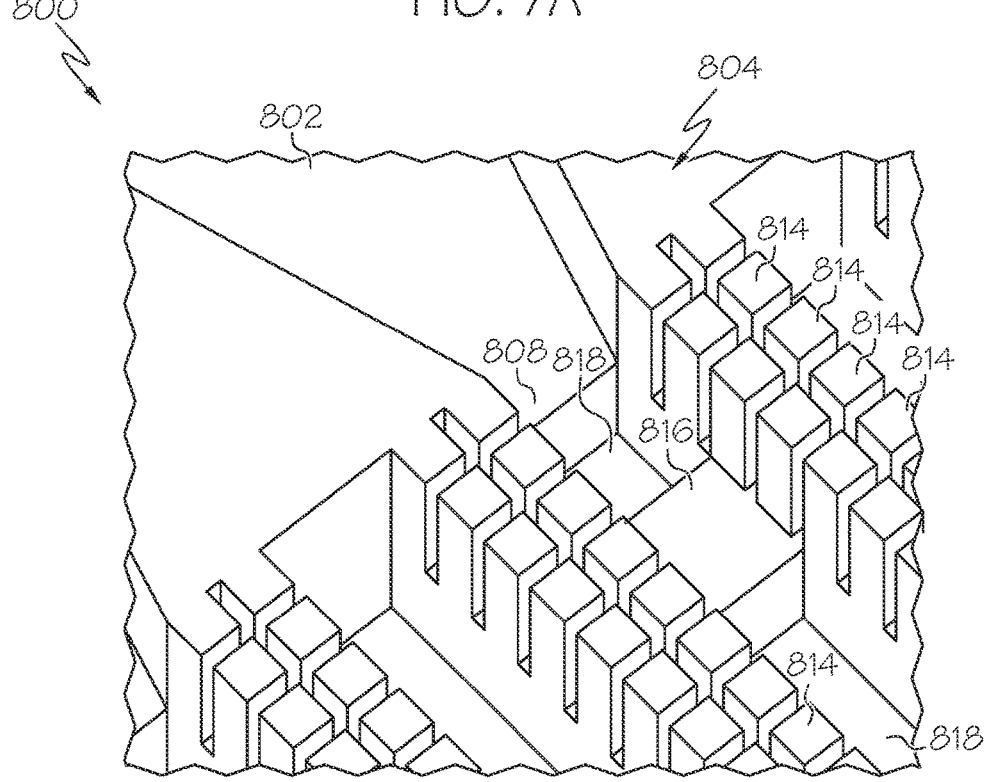
FIG. 7B schematically depicts a detailed view of the manifold shown in FIG. 7A.

Referring now to FIGS. 7A and 7B, a manifold 800 is shown, according to varying embodiments. The manifold 800 may be constructed partially of silicon oxide, silicon, gallium nitride, metals, or any other material of the like. The manifold 800 may be similar in nature to manifold 130, manifold 500, manifold 600, and manifold 700, as discussed in greater detail above. The manifold 800 may include a manifold top surface 802, a manifold bottom surface 803, an array of inlet guides 804, an array of inlet channels 810, an array of outlet channels 812, an array of outlet guides 840, and a plurality of pin fins 814. The array of inlet guides 804 may include a guide sidewall 806 and an inlet area 808.

The plurality of pin fins 814 may extrude from the manifold top surface 802 of the manifold 800 in a perpendicular direction to the manifold top surface 802. Additionally, the plurality of pin fins 814 may be located between the array of inlet channels 810 and the array of outlet channels 812. The plurality of pin fins 814 are fluidly coupled to the array of outlet channels 812, the array of inlet channels 810 and the inlet area 808 directly together. In this way, liquid coolant from the inlet area 808 and the array of inlet channels 810 may wick via fluid capillary action into the plurality of pin fins 814 and into the array of outlet channels 812 via the plurality of pin fins 814. Accordingly, any entrapped vapor coolant within the plurality of pin fins 814 or within the array of outlet channels 812 may come into contact with liquid coolant from the inlet area 808 and/or the array of inlet channels 810.

In embodiments, the array of inlet channels 810 of the manifold 800 includes a plurality of spacer elements 816 that define a plurality of channel cavities 818. The plurality of spacer elements 816 are interlaced with the plurality of channel cavities 818 and are distributed along a length of the array of inlet channels 810. Each of the plurality of channel cavities 818 are defined by a pair of adjacent spacer elements 816 and extend along a depth of the manifold 800 (e.g., from the manifold top surface 802 to the manifold bottom surface 803 of the manifold 800). Each pair of adjacent spacer elements 816 may have tapered profiles, thereby causing each channel cavity 818 to define a jetted nozzle profile for coolant to enter into. In other words, as coolant enters the array of inlet channels 810 from the inlet area 808, the coolant is distributed along the length of each of the array of inlet channels 810 within the plurality of channel cavities 818 by fluid capillary wicking action. This allows for coolant to be targeted to predetermined areas of the manifold 800 which allows for targeted cooling capabilities for the manifold 800.

From the above, it is to be appreciated that defined herein is a cooler device for thermal management of CPU or GPU devices found in data centers, or power electronics devices found in vehicle energy conversion applications. The cooler device includes a cold plate, a manifold, and a manifold case, or cover. The manifold case includes a fluid inlet, a fluid outlet, and at least one vapor outlet. The manifold is constructed at least partially of silicon and defines three-dimensional profiles. The manifold includes an array of inlet channels and an array of outlet channels. Each inlet channel has a first depth. The array of outlet channels are interlaced with the array of inlet channels. Each outlet channel has a second depth that is larger than the first depth. Each of the array of outlet channels has a pair of sidewalls separating each outlet channel from adjacent inlet channels of the array of inlet channels. The three-dimensional profiles allow facilitate targeted cooling within the manifold and increased cooling rate of the manifold. This results in improve cooling capabilities of the manifold.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A cooler device comprising:
a manifold constructed at least partially of silicon, comprising:
an array of inlet channels, each inlet channel having a first depth;
an array of outlet channels interlaced with the array of inlet channels, each outlet channel having a second depth that is larger than the first depth, each of the array of outlet channels having a pair of sidewalls separating each outlet channel from adjacent inlet channels of the array of inlet channels;
a manifold case configured to be in contact with a cold plate and encapsulate the manifold, the array of inlet channels, and the array of outlet channels, the manifold case comprising:
a fluid inlet;
a fluid outlet, wherein the fluid inlet is for receiving coolant into the manifold, and the fluid outlet is for removing the liquid coolant from the; and
at least one vapor outlet, wherein the at least one vapor outlet is for removing a vapor from the manifold.

2. The cooler device of claim 1, wherein the manifold further comprises an array of inlet guides configured to direct coolant to each inlet channel.

3. The cooler device of claim 2, wherein:
a center axis of each inlet guide is coaxial to a center axis of each outlet channel;
each inlet guide tapers outwardly away from the center axis of each inlet guide; and
a pair of inlet guides of the array of inlet guides direct coolant to an inlet channel of the array of inlet channels.

4. The cooler device of claim 1, wherein each inlet channel comprises a plurality of spacer elements disposed along a length of each inlet channel, each of the plurality of spacer elements defining a jetted nozzle profile and are configured to distribute coolant by fluid capillary wicking action along the length of each inlet channel.

5. The cooler device of claim 1, wherein each inlet channel comprises a plurality of jetted inlets.

6. The cooler device of claim 5, wherein each of the plurality of jetted inlets comprise a plurality of steps decreasing in width as each jetted inlet extends away from a top surface of each inlet channel.

7. The cooler device of claim 5, wherein each of the plurality of jetted inlets define a tapered profile decreasing in width as each jetted inlet extends away from a top surface of each inlet channel.

8. The cooler device of claim 1, wherein the manifold is bonded to an array of bonding posts disposed on a cold plate.

9. A cooler device comprising:
a cold plate;
a manifold constructed at least partially of silicon, comprising:
an array of inlet channels, each inlet channel having a first depth; and
an array of outlet channels interlaced with the array of inlet channels, each outlet channel having a second depth that is larger than the first depth; each of the array of outlet channels having a pair of sidewalls separating each outlet channel from adjacent inlet channels of the array of inlet channels; and
a manifold case configured to be in contact with the cold plate and encapsulate the manifold, the array of inlet channels, and the array of outlet channels, the manifold case comprising:
a fluid inlet;
a fluid outlet, wherein the fluid inlet is for receiving coolant into the manifold, and the fluid outlet is for removing the liquid coolant from the manifold; and
at least one vapor outlet, wherein the at least one vapor outlet is for removing a vapor from the manifold.

10. The cooler device of claim 9, wherein the manifold further comprises an array of inlet guides configured to direct coolant to each inlet channel.

11. The cooler device of claim 10, wherein:
a center axis of each inlet guide is coaxial to a center axis of each outlet channel;
each inlet guide tapers outwardly away from the center axis of each inlet guide; and
a pair of inlet guides of the array of inlet guides direct coolant to an inlet channel of the array of inlet channels.

12. A cooler device comprising:
a manifold constructed at least partially of silicon, comprising:
an array of inlet channels, each inlet channel having a first depth; and
an array of outlet channels interlaced with the array of inlet channels, each outlet channel having a second depth that is larger than the first depth, each of the array of outlet channels having a pair of sidewalls separating each outlet channel from adjacent inlet channels of the array of inlet channels, wherein:
each inlet channel comprises a plurality of spacer elements disposed along a length of each inlet channel; and
each spacer element of the plurality of spacer elements defines a jetted nozzle profile and is configured to distribute coolant by fluid capillary wicking action along the length of each inlet channel.

13. The cooler device of claim 12, wherein the manifold further comprises an array of inlet guides configured to direct coolant to each inlet channel.

14. The cooler device of claim 13, wherein:
a center axis of each inlet guide is coaxial to a center axis of each outlet channel;
each inlet guide tapers outwardly away from the center axis of each inlet guide; and
a pair of inlet guides of the array of inlet guides direct coolant to an inlet channel of the array of inlet channels.

15. The cooler device of claim 12, wherein each inlet channel comprises a plurality of jetted inlets.

16. The cooler device of claim 15, wherein each of the plurality of jetted inlets comprise a plurality of steps decreasing in width as each jetted inlet extends away from a top surface of each inlet channel.

17. The cooler device of claim 15, wherein each of the plurality of jetted inlets define a tapered profile decreasing in width as each jetted inlet extends away from a top surface of each inlet channel.

\* \* \* \* \*

UNITED STATES PATENT AND TRADEMARK OFFICE
CERTIFICATE OF CORRECTION

PATENT NO. : 12,274,026 B2  
APPLICATION NO. : 17/748429  
DATED : April 8, 2025  
INVENTOR(S) : Hazra et al.

Page 1 of 2

It is certified that error appears in the above-identified patent and that said Letters Patent is hereby corrected as shown below:

On the Title Page

Item (73), assignee 1, name, delete "Toyota Motor Engineering & Manufacturing North America Inc.," and insert --Toyota Motor Engineering & Manufacturing North America, Inc.,--, therefor.

Item (57), Column 2, Line(s) 5, before "interlaced", delete "are" and insert --is--, therefor.

Item (57), Column 2, Line(s) 6, after "channels", delete "," and insert --.--, therefor.

In the Specification

In Column 1, Line(s) 52, delete "are" and insert --is--, therefor.

In Column 2, Line(s) 7, delete "are" and insert --is--, therefor.

In Column 3, Line(s) 22, delete "refer" and insert --refers--, therefor.

In Column 3, Line(s) 49, after "facilitates", delete "for".

In Column 3, Line(s) 59, before "integrated", delete "use" and insert --uses--, therefor.

In Column 3, Line(s) 59, before "commonly", delete "are" and insert --is--, therefor.

In Column 8, Line(s) 17, after "inlet area", delete ".".

In Column 8, Line(s) 54, after "outlet guides", delete "510" and insert --540--, therefor.

In Column 10, Line(s) 22, before "fluidly", delete "are" and insert --is--, therefor.

In Column 10, Line(s) 58, after "manifold case", delete ",".

Signed and Sealed this  
Twentieth Day of May, 2025

Coke Morgan Stewart  
*Acting Director of the United States Patent and Trademark Office*

CERTIFICATE OF CORRECTION (continued)
U.S. Pat. No. 12,274,026 B2

In the Claims

In Column 11, Line(s) 50, Claim 1, after "from the", insert --manifold--.